United States Patent [19]

Fox, deceased et al.

[11] 4,191,385
[45] Mar. 4, 1980

[54] VACUUM-SEALED GAS-BEARING ASSEMBLY

[76] Inventors: Wayne L. Fox, deceased, late of Castro Valley, Calif.; by Rosemary M. Fox, executrix, 5640 Cold Water Dr., Castro Valley, Calif. 94546

[21] Appl. No.: 39,307

[22] Filed: May 15, 1979

[51] Int. Cl.² .................... B01J 17/00; B16J 15/40
[52] U.S. Cl. ........................... 277/3; 277/226; 277/DIG. 7; 29/569 R; 29/722; 29/743; 29/DIG. 44
[58] Field of Search ............... 277/3, 12, DIG. 7, 226; 29/569 R, 576 R, 584, 722, 743, DIG. 44

[56] References Cited

U.S. PATENT DOCUMENTS

| | | | |
|---|---|---|---|
| 3,201,188 | 8/1965 | Byrne et al. | 29/569 X |
| 3,520,055 | 7/1970 | Jannett | 29/722 X |
| 3,691,720 | 9/1972 | Anderson et al. | 29/DIG. 44 X |
| 3,704,504 | 12/1972 | Koegler | 29/DIG. 44 X |
| 4,141,456 | 2/1979 | Hart | 29/743 X |
| 4,142,004 | 2/1979 | Hauser et al. | 29/584 X |

FOREIGN PATENT DOCUMENTS 1325548  8/1973  United Kingdom ............... 277/DIG. 7

*Primary Examiner*—Robert S. Ward, Jr.
*Attorney, Agent, or Firm*—Thomas E. Schatzel

[57] ABSTRACT

An integral vacuum-sealed gas-bearing assembly comprising a combination of gas-bearing elements and vacuum plenums such that a gas seal is maintained across the bearing separating two assemblies to allow one assembly to be moved relative to the other in finite increments while maintaining an internal vacuum environment.

10 Claims, 3 Drawing Figures

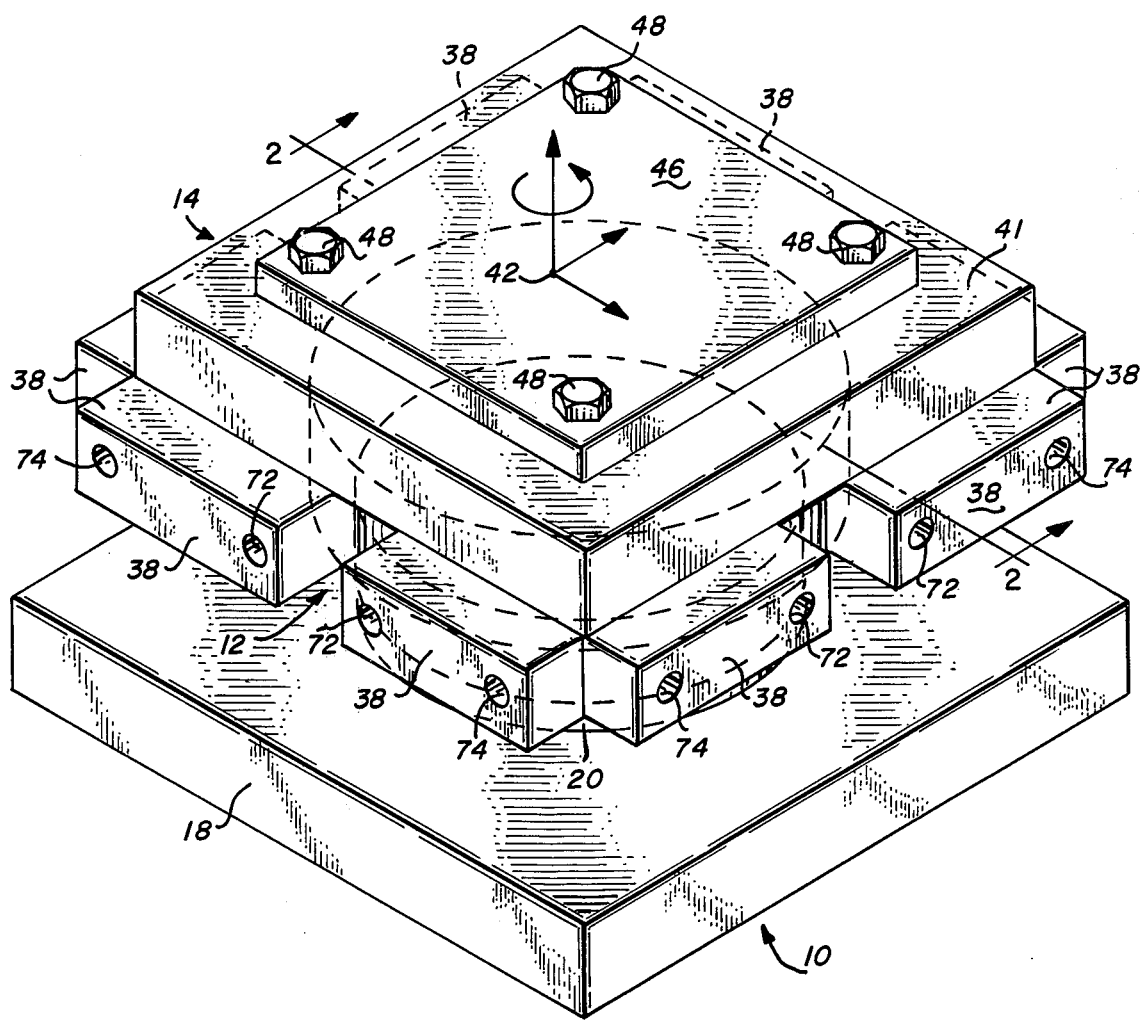
Fig_1

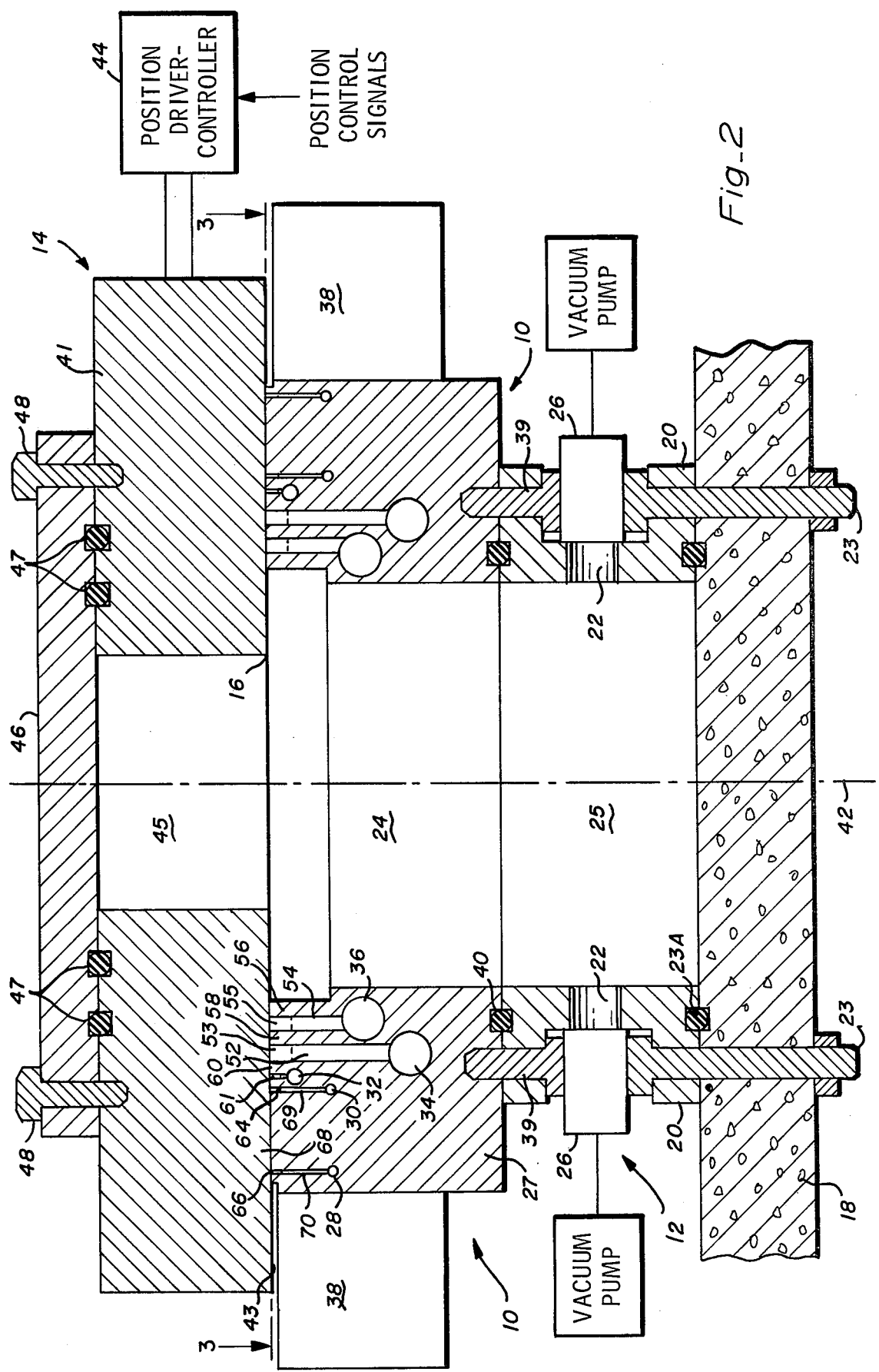

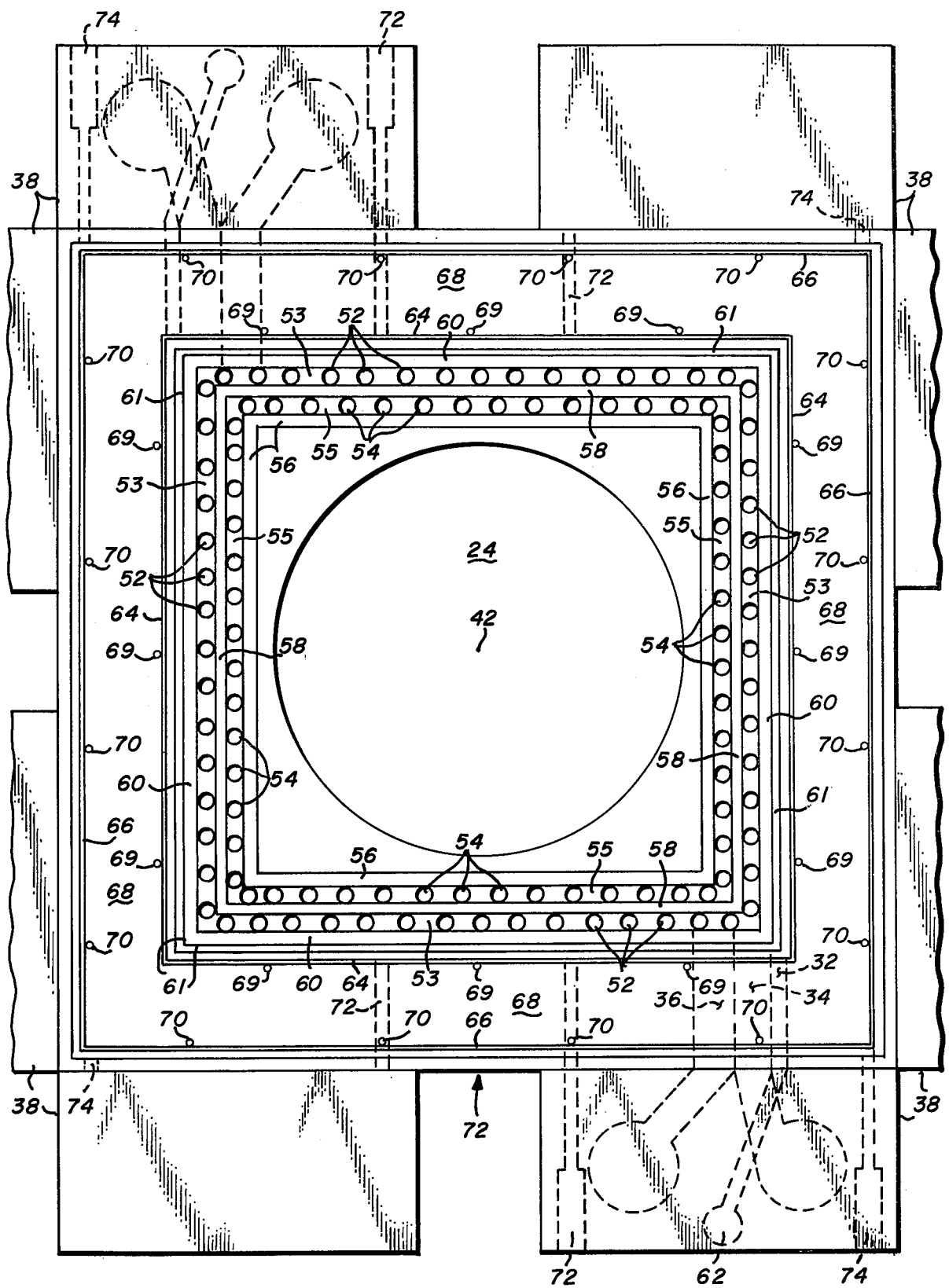
Fig_3

VACUUM-SEALED GAS-BEARING ASSEMBLY

BACKGROUND OF THE INVENTION

1. Field of the Invention

The present invention relates generally to gas-bearing structures and more particularly to an integral vacuum sealed gas-bearing housing assemblies.

2. Description of the Prior Art

In certain technical fields, development tends towards large vacuum housings wherein some elements forming the vacuum chamber are movable relative to other elements forming the vacuum chamber in very precisely, controlled, minute increments. As an example, in the electronic semiconductor industry, electronic beam devices are frequently used for performing functions on silicon devices to form circuits, etc. This requires continuous and/or repeated movement of the device relative to the beam. As such, frequently it is necessary to have continuous, minute, precise, control of the position of the beam relative to the silicon devices within a vacuum environment. This in turn requires finite control of the positioning of the housing enclosing the beam relative to the position of the housing enclosing the silicon devices while maintaining the vacuum environment. With structures heretofore available, it has been necessary to use complex structures and very finely machined parts in order to achieve finite positioning control. Such units are very expensive and delicate to manufacture and maintain.

SUMMARY OF THE PRESENT INVENTION

An object of the present invention is to provide an integral vacuum-sealed gas-bearing housing assembly wherein a high vacuum seal is established between the interior of two relatively movable sub-assemblies and the exterior of the sub-assemblies to allow two sub-assemblies to move relative to one another without friction.

Another object of the present invention is to provide an integral vacuum sealed gas-bearing housing assembly which may be utilized in applications wherein an evacuated vessel need be moved relative to a fixed structure which structure establishes one interfacing wall with such vessel and wherein such motion requires the precision and low friction afforded by gas-bearings, and wherein a vacuum seal need be maintained at the interface.

A further object of the present invention is to provide an integral vacuum sealed gas-bearing housing assembly in which precise rectilinear or rotational motion within a vacuum environment may be communicated through an interface to a pressurized environment.

Briefly, this invention pertains to an integral vacuum sealed air-bearing housing assembly having at least two aligned chamber housings. The housings are movable relative to one another in a common plane. At least one of the housings comprises a combination of gas-bearing elements, compensated or uncompensated, with vacuum plenums or grooves about the common plane such that a gas seal is maintained across the bearing at the planar interface of the two chambers.

A "gas seal" implies that an air pressure differential may be maintained across the bearing interface such that ambient atmospheric pressure (or higher) may be present on one side of the interface while a very low pressure, approaching that of a complete vacuum, may be maintained on the opposite side of the interface without leakage of gas across the bearing interface into the vacuum chamber environment. Gas normally dispelled from the bearing is likewise prevented from entering the vacuum environment.

A "gas bearing" implies a noncontacting interface between fixed and moving elements with a film of flowing gas between the elements and physically separating the elements. Such a film provides a force opposing the gravitational and weight forces which otherwise tend to cause mechanical and frictional interface contact between the two relative moving elements. The gas bearing offers a virtually frictionless interface between the two members while in motion relative to one another. The scope of the present invention includes various geometrical arrangements of the gas-bearing elements and vacuum plenums as well as numerous applications of such mechanisms.

Other objects and advantages of the present invention will become apparent to those skilled in the art after having read the following detailed description of the preferred embodiment as illustrated in the figures of the drawing.

IN THE DRAWING

FIG. 1 is a perspective view of a vacuum-sealed, gas-bearing assembly having a chamber for housing an electronic beam and a chamber for receiving silicon devices on which the electronic beam is to operate;

FIG. 2 is a cross-sectional view of the assembly of FIG. 1 taken along the line 2—2; and FIG. 3 is a cross-sectional view of the structure of FIG. 2 taken along the line 3—3 illustrating the interface wall of one chamber housing with the other chamber housing removed.

DETAILED DESCRIPTION OF THE PREFERRED EMBODIMENT

The drawings illustrate an integral vacuum-sealed, gas-bearing housing assembly referred to by the general reference character 10. The assembly 10 includes a stationary sub-assembly, referred to by the general reference character 12, and a movable sub-assembly referred to by the general reference character 14. In application, the sub-assembly 12 may house an electron beam and the sub-assembly 14 may house silicon devices on which electronic circuits are formed. A planar interface 16 is established intermediate the stationary sub-assembly 12 and the movable sub-assembly 14. The vacuum-sealed, gas-bearing is established about the interface 16 to allow the sub-assembly 14 to move relative to the sub-assembly 12.

A support base 18, e.g. granite table, supports the stationary sub-assembly 12 and movable sub-assembly 14. A circular manifold 20 with vacuum ports 22 is supported on and above the base 18. The manifold 20 is hermetically sealed to the base 18 by a plurality of anchor bolts 23 and O-ring seal 23A. The stationary sub-assembly 12 forms a first chamber 24 which is an extension of a second vacuum chamber 25 formed about the interior of the manifold 20. The chamber 24 may be evacuated of gases by means of high vacuum pumps operating through the pump-port interconnects 26 and the ports 22 of the manifold 20. The chamber 24 is formed about the interior of a bearing block 27. The top surface of block 27 forms the interface with the sub-assembly 14. The block 27 contains geometry to coact with a plurality interconnecting internal ducts 28, 30, 32, 34 and 36. The ducts 28-36 interconnect with a set of eight gas manifold blocks 38 positioned about the periphery of the block 27. The block 27 is bolted and sealed to the manifold 20 by means of a plurality of bolts 39 and an O-ring seal 40. As such, the sub-assembly 12 and manifolds 38 are fixed in place, i.e. stationary with the base 18. Interconnections of the ducts 28 and 30 with the manifold blocks 38 permit interconnection with air pumps to permit pressurization of a gas-bearing about the interface 16. Interconnections of ducts 32, 34 and 36 with the manifolds 38 allow connection of external vacuum pumps to the vacuum sweeper and differential vacuum plenums. The eight manifolds 38 are spaced with two manifolds at each corner so as to retain the air bearing substantially uniform and the pressure at the vacuum plenum relatively uniform.

The sub-assembly includes a rectangular housing 41 adapted for coordinate X-Y displacements as well as rotational movement relative to the axis 42 of the vacuum chamber 24. The housing 41 has a planar smooth surface 43 facing the interface 16. Sub-assembly 14 is driven by a driver 44 to control the axial and radial position of the housing 41 relative to the chamber 24. Sub-assembly 14 has a central chamber 45 formed by the interior walls of the housing 41. The housing 41 communicates directly with the chamber 24. A cover 46 establishes the top wall of the chamber 45 and is attached to the housing 41 by the use of O-ring seals 47 and bolt seals 48 to provide a vacuum seal about the cover 46 and housing 41.

FIG. 3 illustrates in further detail the top plan view of the bearing block 27 and the interior of the chamber 24. As illustrated, the duct 32, 34 and 36 provide a multiple-plenum vacuum seal which is interposed between the vacuum environment within the chamber 24 and a gas-bearing geometry 48 established intermediate the air ducts 28 and 30.

As illustrated, a plurality of parallel cylindrical bores 52 communicate intermediate the duct 34 and a groove 53. Likewise, a plurality of parallel cylindrical bores 54 which communicate intermediate a groove 55 about the interface 16 and the duct 36. A land 56 is formed intermediate the chamber 24 and the groove 55. A land 58 is established intermediate the groove 55 and the groove 53. Likewise, a land 60 is established intermediate the groove 53 and a groove 61 communicating to the duct 32. The lands 56, 58 and 60 have a minute clearance to the moving stage vessel 14 as it is moved about the axis 40 and/or in the X-Y direction. The grooves 61, 53 and 55 establish a multiple-plenum vacuum seal which communicates to the interconnecting ducts 32, 34 and 36, respectively, connected to a vacuum pump connection 62 and thence to a vacuum system to form an inboard sweeping plenum. A pair of narrow air grooves 64 and 66, respectively, are separated by a gas film space 68 which constitutes the air-bearing geometry. The grooves 64 and 66 communicate by holes 69 and 70 to the ducts 30 and 28, respectively. The ducts 28 and 30 are connected to a pair of air pump connections 72 and 74, respectively. The connections 72 and 74 are coupled to air pumps (not shown) to provide the supporting film of gas for the air bearing.

Thus, the vacuum sealed gas-bearing housing assembly 10 is viewed as an integral mechanism, i.e., the operation of the vacuum seal about the chamber is dependent upon the presence of the air bearing about the film space 68, and the vacuum seal cannot be utilized separately from it. The vacuum seal portion of the structure, which may consist of one or several vacuum plenums delineated by adjacent lands, is effective as a seal only when a constant small gap is maintained above the isolation lands about the interface. This gap is produced by the gas-bearing lift created through the grooves 64 and 66 interconnected to air pumps through connections 72 and 74. The precision of the gap at the interface 16 is related to the stiffness of the gas-bearing, i.e., the change in air-film thickness is a function of vertical (compressive) force applied to the gas-bearing. In some applications, compensated gas-bearings may be required to maintain sufficient accuracy of the gap under conditions of varying load while other applications may not require such compensation.

Generally, as illustrated in the preferred embodiment of housing 10, the housing is designed to situate the gas-bearing to that side of the interface which intersects ambient pressure. Escape of gas at this interface is usually of no consequence. However, gas which is expelled at the low-pressure side of the gas-bearing must be swept up at a low-pressure plenum so as to avoid its escaping to the intended vacuum chamber. Thus, as the spacing intermediate the air grooves and vacuum chamber interface progresses, plenums of progressively lower air pressure are required. Each plenum and its isolating land acts to remove residual gas until the required degree of isolation is achieved at the vacuum interface. The necessary number of such vacuum plenum stages depend upon the ultimate level of vacuum required and the pumping rate of the vacuum environment together with the precision of the gas-bearing gap. Thus, the total interface consists of a pressurized area filled by a flowing gas film (which provides the bearing lift) with an inboard sweeper plenum, followed by progressively lower pressure areas on the side toward the vacuum interface.

While this invention has been particularly shown and described with reference to a preferred embodiment thereof, it will be understood by those skilled in the art that various changes in form and detail may be made therein without departing from the spirit and scope of the invention.

What is claimed is:

1. An integral vacuum sealed gas-bearing housing assembly comprising, in combination:
    a first sub-assembly housing means establishing a first internal chamber, said first sub-assembly having a first planar surface about the periphery of said first chamber and a plurality of vacuum plenums delineated by adjacent lands and extending to said planar surface;
    a plurality of individual plenum ducts connected to said plenums;
    manifold means for interconnecting said plenum ducts to vacuum pump means;
    at least one gas-bearing means within said first sub-assembly about said first planar surface and extending about the perimeter of the chamber and spaced laterally from said plenums;
    at least one gas duct within the side wall of said first housing and interconnected to the gas-bearing means;
    manifold means for interconnecting the gas duct to a gas pump means to pump gas therein at a pressure above atmospheric pressure;
    a second sub-assembly housing means forming a second internal chamber communicating with said first internal chamber, said second sub-assembly housing means having a second planar surface, said second planar surface being in face-to-face orientation with said first planar surface and overlapping said individual plenums and said gas-bearing groove; and driver means for moving said second sub-assembly housing means relative to said first sub-assembly housing means whereby gas pumped within said gas duct establishes a gas bearing about the interface of said first and second planar surfaces to establish a spacing intermediate the first and second sub-assemblies and said vacuum pump means removes gas from said interface intermediate the gas-bearing means and said internal chambers.

2. An integral vacuum-sealed gas-bearing housing assembly of claim 1 wherein, the gas-bearing means includes at least two laterally spaced gas-bearing grooves extending about said first planar surface, said gas-bearing grooves being adjacent to one another and extending about the perimeter of said vacuum plenums.

3. An integral vacuum-sealed gas-bearing housing assembly of claim 2 further including, port means communicating with said first chamber; and pump interconnect means to interconnect the port means to vacuum pump means to remove gas from said first and second internal chamber.

4. An integral vacuum-sealed gas-bearing housing assembly of claim 3 wherein, each plenum duct is connected to a separate plurality of vacuum pumps with the individual pumps of each plurality being substantially equally spaced about associated ducts.

5. An integral vacuum-sealed gas-bearing housing assembly of claim 3 wherein, at least one of said plenum ducts is connected to one of said vacuum ducts by means of a plurality of individual bores.

6. An integral vacuum-sealed gas-bearing housing assembly of claim 5 wherein, at least two adjacent plenum ducts are connected to individual vacuum ducts each by means of a plurality of individual bores.

7. An integral vacuum-sealed gas-bearing housing assembly of claim 6 wherein, at least one plenum duct is connected to one of said vacuum ducts by means of a continuous groove parallel to said vacuum duct.

8. An integral vacuum-sealed gas-bearing housing assembly of claim 7 wherein, each plenum duct is connected to a separate plurality of vacuum pump with the individual pumps of each plurality being substantially equally spaced about associated ducts.

9. An integral vacuum-sealed gas-bearing housing assembly of claim 8 wherein, each plenum circumscribes the internal chamber and is adjacent to at least one other plenum and at least one of said plenums is adjacent to the periphery of said internal chamber; and each gas-bearing groove circumscribes each of the plenums.

10. An integral vacuum-sealed gas-bearing housing assembly of claim 9 wherein, each gas-bearing groove is adjacent to another gas-bearing groove and one gas-bearing groove is adjacent to the exterior of the first sub-assembly housing.

* * * * *